United States Patent
Yang et al.

(10) Patent No.: US 8,298,950 B2
(45) Date of Patent: Oct. 30, 2012

(54) METHOD OF ETCHING SACRIFICIAL LAYER

(75) Inventors: Chan-Lon Yang, Taipei (TW); Yeng-Peng Wang, Kaohsiung County (TW); Chiu-Hsien Yeh, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 346 days.

(21) Appl. No.: 12/830,370

(22) Filed: Jul. 5, 2010

(65) Prior Publication Data

US 2012/0003835 A1    Jan. 5, 2012

(51) Int. Cl.
*H01L 21/311*    (2006.01)
(52) U.S. Cl. ....................................................... 438/696
(58) Field of Classification Search .................. 438/696; 216/46
See application file for complete search history.

(56) References Cited

U.S. PATENT DOCUMENTS

2011/0237062 A1 *   9/2011   Na et al. ..................... 438/592
* cited by examiner

*Primary Examiner* — Roberts Culbert
(74) *Attorney, Agent, or Firm* — Ding Yu Tan

(57) ABSTRACT

An exemplary method of etching sacrificial layer includes steps of: providing a substrate formed with a sacrificial layer and defined with a first region and a second region, the sacrificial layer disposed in both the first and second regions; forming a hard mask covering the first region while exposing the second region; performing a first etching process on the sacrificial layer to thin the sacrificial layer while forming a byproduct film overlying the thinned sacrificial layer; performing a second etching process on the byproduct film to remove a portion of the byproduct layer for exposing a portion of the thinned sacrificial layer, while another portion of the byproduct film disposed on sidewalls of the thinned sacrificial layer being remained; and performing a third etching process on the thinned sacrificial layer, to remove the portion of the thinned sacrificial layer exposed in the second etching process.

14 Claims, 3 Drawing Sheets

METHOD OF ETCHING SACRIFICIAL LAYER

BACKGROUND

1. Technical Field

The present invention generally relates to a method of etching a sacrificial layer and, particularly to a method of etching a sacrificial layer adapted for integrated circuit (IC) processes.

2. Description of the Related Art

In the fabrication technology of integrated circuits, a high dielectric constant (high-K) dielectric layer /metal gate (also abbreviated as HK/MG) technology has been widely adopted, such HK/MG technology would facilitate the manufacturers to lower the leakage current of devices, so that the performance of ICs can be continuously improved. Nowadays, there are two types of parallel HK/MG integration solutions of gate-first process and gate-last process. At the aspect of the gate-first process, the HK/MG structure is formed before the formation of the gate; while at the aspect of the gate-last process, the metal gate is formed after a dummy poly-gate is removed.

In a conventional gate-last process, the removal of dummy poly-gate primarily is carried out by a dry etching process, however, a plasma used in the dry etching process would easily damage a barrier layer of titanium nitride formed above the high-K dielectric layer, so that the finished device encounters the issue of excessive high leakage current. Accordingly, a purpose of the present invention is to solve the drawbacks associated with the prior art.

BRIEF SUMMARY

The present invention is directed to a method of etching a sacrificial layer, adapted for an integrated circuit process, so as to overcome the drawbacks of device electric-leakage and undercut caused by side etching associated with the conventional etching process.

More specifically, a method of etching a sacrificial layer in accordance with an embodiment of the present invention is provided. The method includes steps of: providing a substrate formed with a sacrificial layer and defined with a first region and a second region, the sacrificial layer disposed in both the first region and the second region; forming a hard mask covering the first region while exposing the second region; performing a first etching process on the sacrificial layer on the substrate to thin the sacrificial layer while forming a byproduct film overlying the thinned sacrificial layer; performing a second etching process on the byproduct film to remove a portion of the byproduct film for exposing a portion of the thinned sacrificial layer, while another portion of the byproduct film disposed on sides of the thinned sacrificial layer being remained; and performing a third etching process on the thinned sacrificial layer having the remained byproduct film disposed on the sides thereof, to remove the portion of the thinned sacrificial layer exposed in the second etching process.

In one embodiment, the sacrificial layer in the second region can include a dummy poly-gate and a dummy polysilicon layer, the substrate can be a silicon substrate, the byproduct film can be a polymer film, a material of the hard mask can be silicon oxide, metal or metal nitride, the metal can be tungsten or titanium, and the metal nitride can be titanium nitride or tantalum.

In one embodiment, the method further includes a step of: performing a fourth etching process to remove the remained byproduct film disposed on the sides of the sacrificial layer, wherein the fourth etching process includes a wet etching process with an etchant of diluted hydrofluoric acid.

In one embodiment, the first etching process uses a gaseous mixture of hydrogen bromide, nitrogen and nitrogen trifluoride to thin the sacrificial layer, and a material of the byproduct film includes silicon oxide and titanium nitride.

In one embodiment, the first region and the second region respectively are an N-type metal-oxide-semiconductor (MOS) transistor region and a P-type MOS transistor region, or vice versa.

In one embodiment, the first etching process and the second etching process belong to a type of anisotropic dry etching, and the third etching process belongs to a type of isotropic wet etching.

In one embodiment, the second etching process further includes a step of: altering a material property of the portion of the thinned sacrificial layer after removing the portion of the byproduct film, for facilitating the performing of the subsequent third etching process.

In one embodiment, the step of altering the material property of the portion of the thinned sacrificial layer includes: prolong the second etching process, and performing a treatment on the portion of the thinned sacrificial layer exposed in the second etching process to break a chemical structure of the portion of the thinned sacrificial layer.

In one embodiment, the step of altering the material property of the portion of the sacrificial layer includes: implanting charge-neutral particles into the portion of the thinned sacrificial layer exposed in the second etching process to break a structure of the portion of the thinned sacrificial layer.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1A:
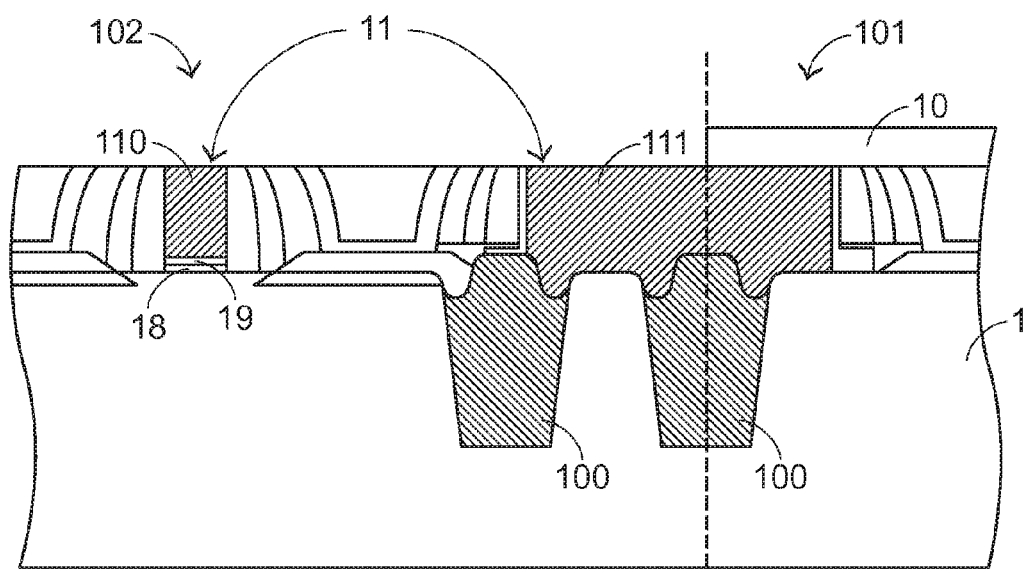
FIGS. 1(a) through 1(e) show an implementation process of a method of etching a sacrificial layer, in accordance with an embodiment of the present invention.

A better understanding of the above and many other features and advantages of the novel method of etching a sacrificial layer of the present invention may be obtained from a consideration of the detailed description of some exemplary embodiments thereof below, particularly if such consideration is made in conjunction with the appended drawings, wherein like reference numerals are used to identify like elements illustrated in one or more of the figures thereof.

FIGS. 1(a), 1(b), 1(c), 1(d) and 1(e) illustrate an implementation process of a method of etching a sacrificial layer in accordance with an embodiment of the present invention. In the illustrated embodiment, a process of manufacturing a static random access memory (SRAM) on a silicon substrate is taken as an example for the purpose of illustration. Since the SRAM primarily is constituted by P-type metal-oxide-semiconductor transistors (also referred to as PMOSs) and N-type metal-oxide-semiconductor transistors (also referred to as NMOSs), the silicon substrate 1 would have two types of defined regions i.e., NMOS region 101 and PMOS region 102, or vice versa, separated by shallow trench isolation (STI)

structures 110. In FIG. 1(a). The silicon substrate 1 further has a sacrificial layer 11 formed thereon and disposed in both the NMOS region 101 and the PMOS region 102. A hard mask 10 is necessarily required to cover the NMOS region 101 on the silicon substrate 1, but the PMOS 102 is exposed (i.e., uncovered by the hard mask 10) for facilitating the removal of the sacrificial layer 11 in the NMOS region 101. The sacrificial layer 11 may include structures of a dummy poly-gate 110 and a dummy polysilicon layer 111 as illustrated in FIG. 1(a), and so on. Herein, the dummy polysilicon layer 111 includes two parts respectively disposed in the NMOS region 101 and the PMOS region 102 and connected at an interface between the NMOS region 101 and the PMOS region 102. The hard mask 10 can be formed by metal (e.g., titanium (Ti) or tungsten (W)) or a metal nitride (e.g., titanium nitride (TiN) or Tantalum nitride (TaN)) or a dielectric material (e.g., silicon oxide), which has a high etching selectivity ratio with respect to the sacrificial layer 11.

Figure 1B:
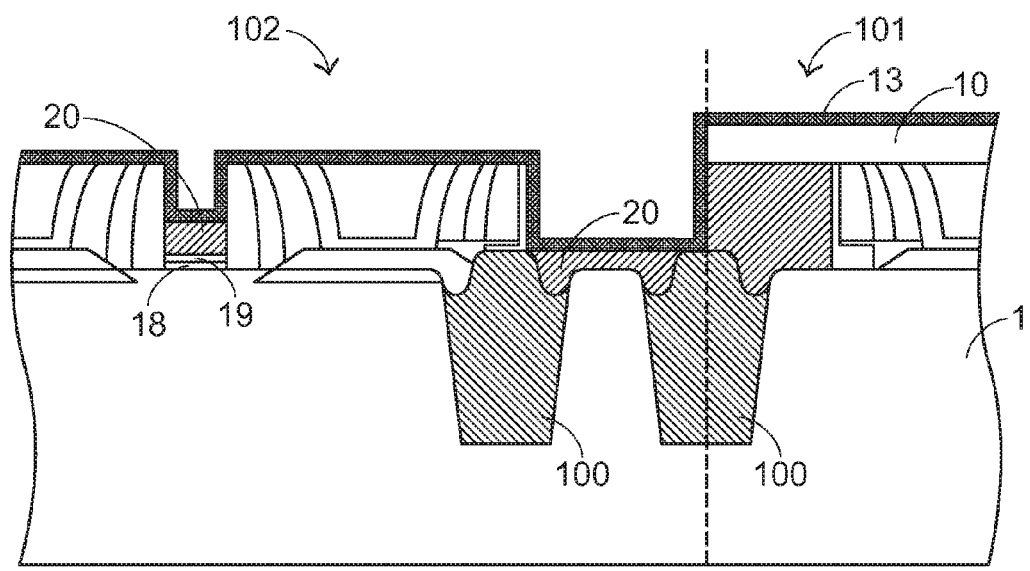

As illustrated in FIG. 1(b), the etching selectivity ratio between the hard mask 10 and the sacrificial layer 11 is utilized for performing a first etching process on the exposed dummy poly-gate 110 and the exposed portion of the dummy polysilicon layer 111. The first etching process herein is an anisotropic dry etching process. In order to protect a barrier layer 19 of titanium nitride formed on a high-K gate dielectric layer 18 from damage in the first etching process, the first etching process would be terminated before the dummy poly-gate 110 is not completely removed and whereby the portion of polysilicon 20 (which is the unremoved portions of the exposed dummy poly-gate 110 and the exposed portion of the dummy polysilicon layer 111) as illustrated in FIG. 1(b) is remained. In other words, the first etching process herein is to thin the sacrificial layer 11. Moreover, in the first etching process using the hard mask 10 as an etch mask, a byproduct film 13 as illustrated in FIG. 1(b) is formed attached to the top surface of the silicon substrate 1. In the illustrated embodiment, the anisotropic etching process can be a usually-used dry etching process such as, a dry etching process using the hard mask 10 as the etch mask and using a gaseous mixture of hydrogen bromide (HBr), nitrogen (N2) and nitrogen trifluoride (NF3) to partly remove the exposed (i.e., uncovered by the hard mask 10) polysilicons, and the byproduct film 13 correspondingly is a polymer film including silicon oxide and titanium nitride.

Figure 1C:
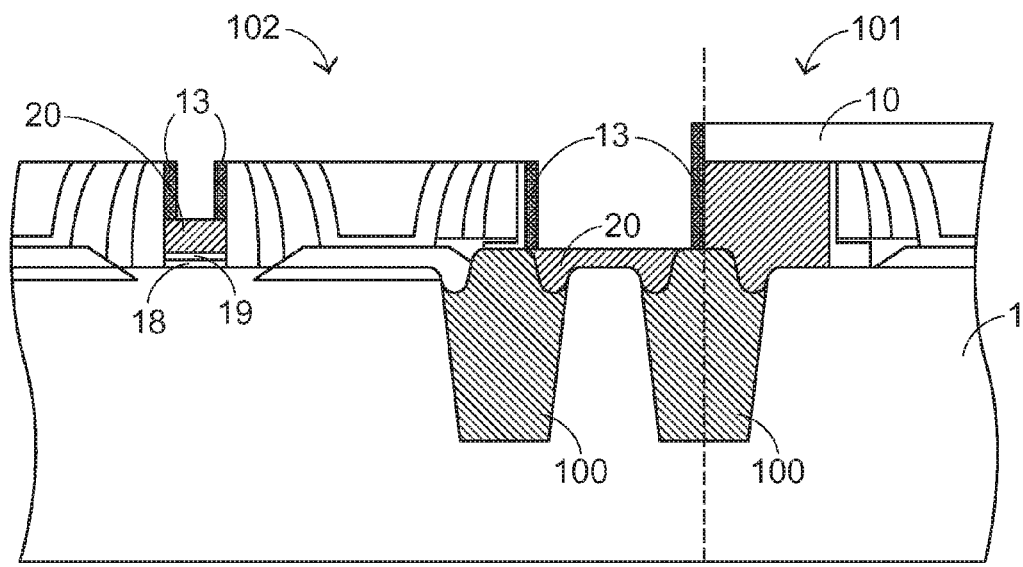

Subsequently, as illustrated in FIG. 1(c), a second etching process is performed to etch the byproduct film 13. Herein, since the byproduct film 13 formed in the first etching process can serve as a protecting film in the subsequent etching process, the second etching process for partly removing the byproduct film 13 preferably is an anisotropic etching process, and whereby a portion of the byproduct film 13 disposed on sidewalls of the surface structure of the silicon substrate 1 is remained. As seen from FIG. 1(c), in other words, the remained byproduct film 13 is disposed on sides of the remained polysilicon 20. Furthermore, the remained polysilicon 20 is exposed due to the partly removing of the byproduct film 13.

Figure 1D:
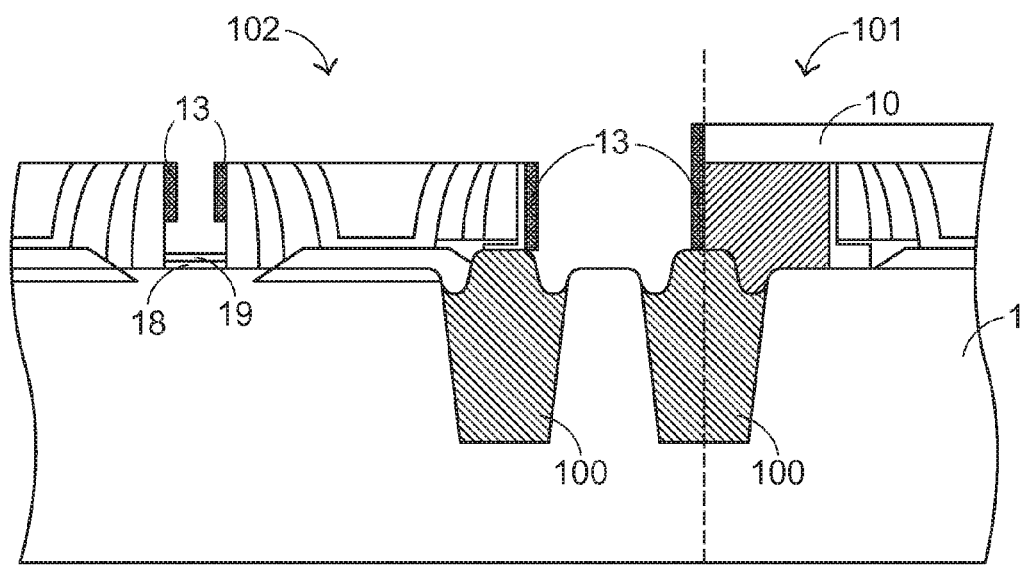

As illustrated in FIG. 1(d), a third etching process is performed to remove the remained polysilicon 20 (including the remained dummy poly-gate 110 and the remained dummy polysilicon layer 111 uncovered by the hard mask 10). In the third etching process, the portion of the dummy polysilicon layer 111 covered by the hard mask 10 is protected by the remained byproduct film 13 from side etching. The third etching process can be chose to be an isotropic etching process such as, a usually-used wet etching process, and therefore the barrier layer 19 of titanium nitride formed on the high-K gate dielectric layer 18 is ensured from being damaged. In addition, the remained byproduct film 13 disposed on the sidewalls can effectively stand against a side etching effect in the third etching process, so that the finally-remained dummy polysilicon layer 111 would not be undercut and thus the integrity of the circuit structures can be retained.

Figure 1E:
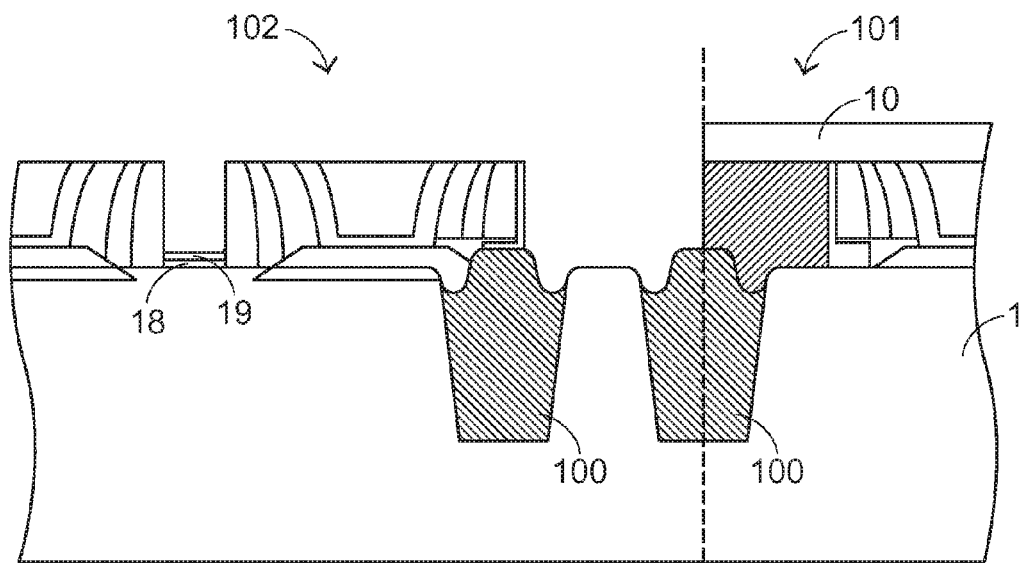

Finally, as illustrated in FIG. 1(e), a fourth etching process is performed to remove the remained byproduct film 13 disposed on the sidewalls. Herein, the fourth etching process can be a wet etching process with an etchant of diluted hydrofluoric acid, so that the remained byproduct film 13 can be removed completely.

Figure 2:
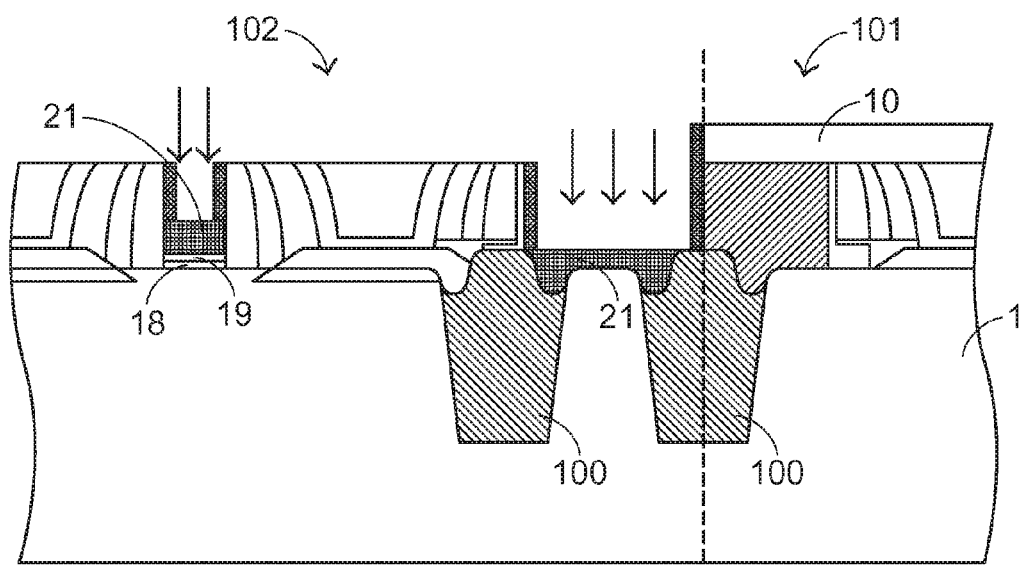
FIG. 2 shows a process of changing polysilicon to be amorphous silicon, in accordance with an embodiment of the present invention.

In addition, in a backend part of the second etching process, a step of altering the material property of the remained portion (i.e., uncovered by the hard mask 10 and exposed in the second etching process) of the sacrificial layer 11 which will be expected to be removed (corresponding to the remained polysilicon 20 in FIG. 1(b)) can be performed for facilitating the performing of the subsequent third etching process. As illustrated in FIG. 2, the exposed polysilicon 20 formed after partly removing the byproduct film 13 is changed to be amorphous silicon 21, so that the etching speed thereof in the third etching process can be accelerated. There are various different approaches to change polysilicon to be amorphous silicon, for example, one approach is that prolong the second etching process, that is performing a treatment on the exposed polysilicon 20 just after partly removing the byproduct film 13 so as to change the polysilicon to be amorphous silicon 21 (herein, the chemical structure of the exposed polysilicon 20 is broke/changed). Of course, besides the approach of changing polysilicon to be amorphous silicon as illustration of FIG. 2, there is other approach to alter the material property of the exposed polysilicon 20 for example, an approach of implanting charge-neutral particles rather than donor and acceptor, such as silicon, germanium (Si,Ge) or argon (Ar) particles into the exposed polysilicon 20, so that the structure (e.g., physical and/or chemical structure) of the polysilicon 20 can be disturbed, the wet etching speed applied to the exposed polysilicon 20 can be accelerated, and the phenomenon of undercut caused by side etching effect can be suppressed consequently.

In summary, according to the improvements associated the embodiments of the present invention, the issue of high leakage current resulting from the damage of barrier layer associated with the prior art can be eliminated, and further the phenomenon of undercut caused by side etching effect can be suppressed. The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of etching a sacrificial layer, adapted for an integrated circuit process and comprising:

providing a substrate formed with a sacrificial layer, and defined with a first region and a second region, wherein the sacrificial layer disposed in both the first region and the second region;

forming a hard mask covering the first region while exposing the second region;

performing a first etching process on the sacrificial layer on the substrate by using the hard mask as an etch mask to thin the sacrificial layer while forming a byproduct film overlying the thinned sacrificial layer;

performing a second etching process on the byproduct film to remove a portion of the byproduct film for exposing a portion of the thinned sacrificial layer, while another portion of the byproduct film disposed on sides of the thinned sacrificial layer being remained; and performing a third etching process on the thinned sacrificial layer having the remained byproduct film disposed on the sides thereof, to remove the portion of the thinned sacrificial layer exposed in the second etching process.

2. The method of etching a sacrificial layer as claimed in claim 1, wherein the sacrificial layer comprises a dummy poly-gate and a dummy polysilicon layer.

3. The method of etching a sacrificial layer as claimed in claim 2, wherein the first etching process uses a gaseous mixture of hydrogen bromide, nitrogen and nitrogen trifluoride to thin the dummy poly-gate and the dummy polysilicon layer.

4. The method of etching a sacrificial layer as claimed in claim 1, wherein the substrate is a silicon substrate.

5. The method of etching a sacrificial layer as claimed in claim 1, wherein the byproduct film is a polymer film.

6. The method of etching a sacrificial layer as claimed in claim 5, wherein the byproduct film comprises silicon oxide and titanium nitride.

7. The method of etching a sacrificial layer as claimed in claim 5, further comprising a step of:
performing a fourth etching process to remove the remained byproduct film disposed on the sides of the sacrificial layer, wherein the fourth etching process comprises a wet etching process with an etchant of diluted hydrofluoric acid.

8. The method of etching a sacrificial layer as claimed in claim 1, wherein the first region and the second region respectively are a N-type metal-oxide-semiconductor (MOS) transistor region and a P-type MOS transistor region.

9. The method of etching a sacrificial layer as claimed in claim 1, wherein the first etching process and the second etching process belong to a type of anisotropic dry etching, and the third etching process belongs to a type of isotropic wet etching.

10. The method of etching a sacrificial layer as claimed in claim 1, wherein a material of the hard mask comprises silicon oxide, metal or metal nitride.

11. The method of etching a sacrificial layer as claimed in claim 10, wherein the metal is tungsten or titanium, and the metal nitride is titanium nitride or tantalum nitride.

12. The method of etching a sacrificial layer as claimed in claim 1, wherein the second etching process further comprises a step of:
changing a material property of the portion of the thinned sacrificial layer after removing the portion of the byproduct film, for facilitating the performing of the subsequent third etching process.

13. The method of etching a sacrificial layer as claimed in claim 12, wherein the step of changing the material property of the portion of the thinned sacrificial layer comprises:
prolonging the second etching process, and performing a treatment on the portion of the thinned sacrificial layer exposed in the second etching process to break a chemical structure of the portion of the thinned sacrificial layer.

14. The method of etching a sacrificial layer as claimed in claim 12, wherein the step of changing the material property of the portion of the sacrificial layer comprises:
implanting charge-neutral particles into the portion of the thinned sacrificial layer exposed in the second etching process to break a structure of the portion of the thinned sacrificial layer.

* * * * *